United States Patent
St. John et al.

(10) Patent No.: US 11,341,682 B2
(45) Date of Patent: May 24, 2022

(54) TESTING AND VALIDATION OF A CAMERA UNDER ELECTROMAGNETIC INTERFERENCE

(71) Applicant: Argo AI, LLC, Pittsburgh, PA (US)

(72) Inventors: Christopher N. St. John, Northville, MI (US); Morgan M. Wagner, Pittsburgh, PA (US)

(73) Assignee: ARGO AI, LLC, Pittsburgh, PA (US)

( * ) Notice: Subject to any disclaimer, the term of this patent is extended or adjusted under 35 U.S.C. 154(b) by 116 days.

(21) Appl. No.: 16/993,044

(22) Filed: Aug. 13, 2020

(65) Prior Publication Data

US 2022/0051438 A1    Feb. 17, 2022

(51) Int. Cl.
| | |
|---|---|
| *G06T 7/80* | (2017.01) |
| *G06T 7/00* | (2017.01) |
| *G06K 9/62* | (2022.01) |
| *H04N 5/357* | (2011.01) |
| *G01R 29/08* | (2006.01) |

(Continued)

(52) U.S. Cl.
CPC .............. *G06T 7/80* (2017.01); *G06K 9/6215* (2013.01); *G06K 9/6262* (2013.01); *G06T 7/0002* (2013.01); *G06V 20/20* (2022.01); *G06V 20/56* (2022.01)

(58) Field of Classification Search
CPC ......... G06T 7/80; G06T 7/0002; G06V 20/20; G06K 9/6262; G06K 9/6215; H04N 5/3577; G01R 29/0814; G01R 31/001
See application file for complete search history.

(56) References Cited

U.S. PATENT DOCUMENTS 8,326,046 B2 * 12/2012 Rezazadeh ........... G06K 9/6215
                                                                          382/199
8,532,396 B2     9/2013 ReZazadeh et al.
(Continued)

FOREIGN PATENT DOCUMENTS

| EP | 1789945 B1 | 7/2012 |
|---|---|---|
| KR | 20110090731 A | 8/2011 |
| WO | 2019144262 A1 | 8/2019 |

OTHER PUBLICATIONS

International Search Report & Written Opinion of PCT/US2021/045817, dated Dec. 1, 2021, 9 pages.

(Continued)

*Primary Examiner* — Brian P Yenke
(74) *Attorney, Agent, or Firm* — Brooks Kushman P.C.

(57) ABSTRACT

Devices, systems, and methods are provided for testing and validation of a camera. A device may determine a content object placed in a line of sight of a camera device, wherein the content object provides informational and visual content. The device may capture one or more images of the content object. The device may cause an electromagnetic event using an electromagnetic interference device, causing an electromagnetic event to affect an image quality of at least one of the one or more images captured by the camera device. The device may assign a structural similarity index (SSIM) score to the at least one image of the one or more images, wherein the SSIM score indicates a camera validation status of the camera device. The device may assign an SSIM score between on one image taken without the presence of interference and one image taken in the presences of the interference.

20 Claims, 6 Drawing Sheets

(51) Int. Cl.
*G01R 31/00* (2006.01)
*G06V 20/20* (2022.01)
*G06V 20/56* (2022.01)

(56) References Cited

U.S. PATENT DOCUMENTS

| | | | |
|---|---|---|---|
| 9,741,107 B2* | 8/2017 | Xu | G06T 5/002 |
| 10,085,015 B1* | 9/2018 | Westwater | G06T 7/0002 |
| 11,216,698 B2* | 1/2022 | Colligan | G06T 5/20 |
| 2007/0024293 A1 | 2/2007 | Kosaka et al. | |
| 2007/0236207 A1 | 10/2007 | Thomason | |
| 2013/0002273 A1* | 1/2013 | Min | G01R 31/001 |
| | | | 324/750.01 |
| 2013/0163896 A1* | 6/2013 | Chen | G06T 3/0068 |
| | | | 382/294 |
| 2013/0300869 A1 | 11/2013 | Lu et al. | |
| 2014/0241629 A1 | 8/2014 | Lerios et al. | |
| 2016/0004144 A1 | 1/2016 | Laroia et al. | |
| 2016/0029015 A1* | 1/2016 | Jiang | G06T 7/0002 |
| | | | 348/192 |
| 2016/0379094 A1 | 12/2016 | Mittal et al. | |
| 2017/0109590 A1 | 4/2017 | Gehrke | |
| 2017/0313288 A1 | 11/2017 | Tippy et al. | |
| 2019/0164271 A1 | 5/2019 | Herchenbach et al. | |
| 2019/0213730 A1* | 7/2019 | Bhamidipati | G06V 20/56 |
| 2019/0281302 A1 | 9/2019 | Zhang et al. | |
| 2020/0055516 A1 | 2/2020 | Craddock et al. | |
| 2020/0065622 A1 | 2/2020 | Korosi-Szabo et al. | |
| 2020/0084367 A1* | 3/2020 | Amini | G06T 7/0002 |
| 2020/0265239 A1* | 8/2020 | Guo | G06K 9/6215 |
| 2021/0211740 A1* | 7/2021 | Wang | B60R 1/00 |
| 2021/0369201 A1* | 12/2021 | Jiménez-Martínez | |
| | | | G01N 24/006 |
| 2021/0373092 A1* | 12/2021 | Iwata | G01R 33/0094 |

OTHER PUBLICATIONS

Li et al. "Content-Partitioned Structural Similarity Index for Image Quality Assessment", Signal Processing: Image Communication, 2010, pp. 517-526, vol. 25, issue 7, ScienceDirect.

Krishnan, V. "Self-Driving Bugaloo: How Ford is Keeping Autonomous Car Sensors Squeaky Clean", Medium, Sep. 4, 2019, United States.

* cited by examiner

TESTING AND VALIDATION OF A CAMERA UNDER ELECTROMAGNETIC INTERFERENCE

TECHNICAL FIELD

This disclosure generally relates to systems and methods for testing and validation of a camera under electromagnetic interference.

BACKGROUND

Many vehicles employ one or more cameras for various purposes. For example, a camera mounted a vehicle may be coupled to an electronic assembly having an image processing component that processes images in a video feed provided by the camera to detect other vehicles traveling in front of the vehicle. Proper operation of a camera module in the presence of a field of some amount of radiated intensity of electromagnetic interference is an important aspect of the camera module. The camera should not be interrupted from its normal function under the presence of electromagnetic interference from the radiated emissions of another device or through conducted emission of a device sharing a common connection. These emissions events may cause interference and alteration of the image quality of the camera. Therefore, it may be desirable to enhance the testing and validation of a camera to ensure that it does not provide inconsistent or unreliable image quality that undermines its normal operation.

Certain implementations will now be described more fully below with reference to the accompanying drawings, in which various implementations and/or aspects are shown. However, various aspects may be implemented in many different forms and should not be construed as limited to the implementations set forth herein; rather, these implementations are provided so that this disclosure will be thorough and complete, and will fully convey the scope of the disclosure to those skilled in the art. Like numbers in the figures refer to like elements throughout. Hence, if a feature is used across several drawings, the number used to identify the feature in the drawing where the feature first appeared will be used in later drawings.

DETAILED DESCRIPTION

Example embodiments described herein provide certain systems, methods, and devices for enhanced multispectral sensor calibration.

In one or more embodiments, a testing and validation system may facilitate the setup of a camera in an electromagnetic interference environment, which is constrained in both its required setup as well as the environment it is in. In addition to the Federal Communications Commission (FCC) requirements for proper operation of a device in the presence of a field of some amount of radiated intensity, image quality is an important aspect of a camera. A device (e.g., a camera) should not be interrupted from its normal function under the presence of electromagnetic interference. A radiated immunity event is an event where a device (e.g., a camera) encounters a variety of electric field disturbances during its normal usage. Further, a radiated emissions event refers to both the intentional and unintentional release of electromagnetic energy from an electronic device (e.g., a camera). Finally, a conducted emissions event refers to the mechanism that enables electromagnetic energy to be created in the camera and coupled to its power cord. These events may cause interference and alteration of the image quality of the camera.

In one or more embodiments, a testing and validation system may combine a scale-invariant target with a target-independent camera metric, which allows a wide variety of errors in camera performance to be detected from an expected baseline without an application-specific behavior being required. An application-specific behavior may be tied to the type of tests being performed, such as sharpness test, blurred lines test, resolution test, modulation transfer function (MTF), chromatic aberration test, white balance, color response, color error, and any other specific tests.

In one or more embodiments, a testing and validation system may facilitate a validation test for a camera under electromagnetic interference. A testing and validation system may provide a mechanism to allow a pass or fail criteria to be judged on the camera under test in real-time during the testing and provides a target framework and a backend processing framework together in real-time application. A testing and validation system may allow for a testing and validation environment that does not require having to tune the camera for ideal lighting conditions, setup, distance, etc., which are typically required by camera tests. That is, there is no need to determine pixel sizes or determine a specific color palette, which is typically used to perform image quality tests.

In one or more embodiments, a testing and validation system may facilitate an application-independent methodology by using a metric associated with the validation of a camera system. The metric may be described in the notion of a normal state and the notion of interrupted or fail state based on a radiated immunity event, a radiated emissions event, or a conducted emissions event. For example, a testing and validation system may facilitate that a quality of a captured optical signal is independent of the camera's resolution, field-of-view, orientation, lighting, or specific knowledge of the application of the camera's data. The testing and validation system may facilitate a generalized pass or fail criteria independent of the metric, under a degraded event, yet still be relevant to a broad set of applications (e.g., recognizing faces, cars, etc.). The signal received from a degraded event using a particular image (e.g., spilled coins image) is independent of the camera's application but still represents correctness to a wide variety of camera applications.

Therefore, a testing and validation system would lend itself to a before and after judgment and a notion of using a particular index that will allow a before and after score as to whether a camera system is performing to a predetermined level. The score may be tied to image quality by using a particular index.

In one or more embodiments, a testing and validation system may facilitate a structural similarity index measurement (SSIM) to be used as the particular index. The SSIM may be a perceptual metric that quantifies image quality degradation caused by processing an image. SSIM may provide a measure of the perceptual difference between two images. SSIM allows for a more generalized set of scores that apply more broadly to a large set of image applications. For example, traditional image quality metrics such as slanted edges, color charts, or other metrics require an analysis of different metrics to get the full picture, whereas SSIM provides a simpler way to capture failure modes independent of the application. SSIM provides an index associated with a large amount of information while using one score. As long as a known good environment is established, there is no need to calibrate a color chart or other metrics before capturing an SSIM score. In this case, SSIM would provide a pass or fail score, which is a simple way to capture failure conditions.

In one or more embodiments, a testing and validation system may use a particular pattern associated with the application-independent methodology used to validate a camera system under a radiated immunity event, a radiated emissions event, or a conducted emissions event. The particular pattern would be used in conjunction with an SSIM scale in the before and after judgment. The particular pattern may comprise a variety of textures and frequency of content that allows it to be applied to a different camera fields of use, different camera distances, and becomes agnostic of the camera system set up compared to other approaches in performing optical tests. The particular pattern may be a spilled coins image, which is typically used to measure a texture sharpness. A spilled coins image is an image processing pattern that allows the evaluation of sharpness. It has a frequency of content pattern, which allows it to judge what had a variety of extra detail levels. Other types of sharpness targets do not capture that as well.

In one or more embodiments, a testing and validation system may facilitate a novel linkage of applying a metric (e.g., SSIM) to a camera system under a radiated immunity event, a radiated emissions event, or a conducted emissions event while using a particular pattern such as a spilled coins image. The camera system may be related to one of a wide-field view cameras, stereo cameras, automotive cameras, backup cameras, color or monochrome cameras, autonomous vehicle cameras, or anything that utilizes an optical path.

In one or more embodiments, a testing and validation system may facilitate judging whether a processing circuitry of a vehicle would perceive an image captured by a camera of the vehicle to be what it is supposed to be when the camera is subjected to electromagnetic interference. The testing and validation may be performed quickly and effortlessly independently from the judgment criteria that would have to be derived from some image quality standard metric or some image quality specification, for example, a sharpness test.

The above descriptions are for purposes of illustration and are not meant to be limiting. Numerous other examples, configurations, processes, etc., may exist, some of which are described in greater detail below. Example embodiments will now be described with reference to the accompanying figures.

Figure 1:
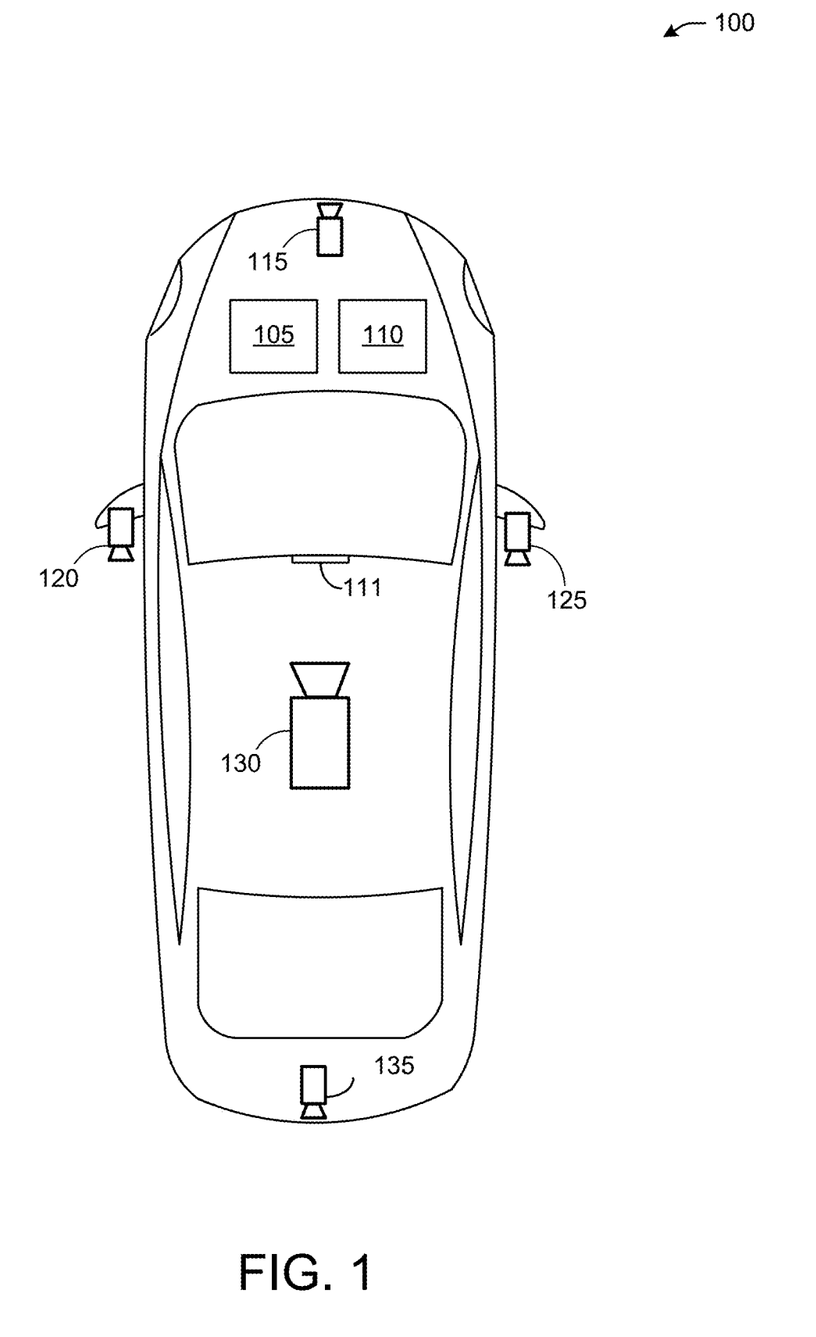
FIG. 1 illustrates an exemplary vehicle equipped with multiple cameras, in accordance with one or more example embodiments of the present disclosure.

FIG. 1 illustrates an exemplary vehicle 100 equipped with multiple cameras. The vehicle 100 may be one of various types of vehicles such as a gasoline-powered vehicle, an electric vehicle, a hybrid electric vehicle, or an autonomous vehicle, and can include various items such as a vehicle computer 105 and an auxiliary operations computer 110.

The vehicle computer 105 may perform various functions such as controlling engine operations (fuel injection, speed control, emissions control, braking, etc.), managing climate controls (air conditioning, heating, etc.), activating airbags, and issuing warnings (check engine light, bulb failure, low tire pressure, vehicle in blind spot, etc.).

The auxiliary operations computer 110 may be used to support various operations in accordance with the disclosure. In some cases, some or all of the components of the auxiliary operations computer 110 may be integrated into the vehicle computer 105. Accordingly, various operations in accordance with the disclosure may be executed by the auxiliary operations computer 110 in an independent manner. For example, the auxiliary operations computer 110 may carry out some operations associated with providing camera settings of one or more cameras in the vehicle without interacting with the vehicle computer 105. The auxiliary operations computer 110 may carry out some other operations in cooperation with the vehicle computer 105. For example, the auxiliary operations computer 110 may use information obtained by processing a video feed from a camera to inform the vehicle computer 105 to execute a vehicle operation such as braking.

In the illustration shown in FIG. 1, the vehicle 100 is equipped with five cameras. In other scenarios, fewer or a greater number of cameras may be provided. The five cameras include a front-facing camera 115, a rear-facing camera 135, a roof-mounted camera 130, a driver-side mirror camera 120, and a passenger-side mirror camera 125. The front-facing camera 115, which may be mounted upon one of various parts in the front of the vehicle 100, such as a grille or a bumper, produces images that may be used, for example, by the vehicle computer 105 and/or by the auxiliary operations computer 110, to interact with an automatic braking system of the vehicle 100. The automatic braking system may slow down the vehicle 100 if the images produced by the front-facing camera 115 indicate that the vehicle 100 is too close to another vehicle traveling in front of the vehicle 100.

Any of the various cameras (e.g., cameras 115, 120, 125, 130, and 135) should not be interrupted from its normal function under the presence of electromagnetic interferences such as a radiated immunity event, a radiated emissions event, or a conducted emissions event. Those events cause degradation of captured images using these cameras. Captured data by the cameras (e.g., cameras 115, 120, 125, 130, and 135) may be raw data that is sent to a vehicle computer 105 and/or by the auxiliary operations computer 110 in order to convert the optical image into processed signals. Therefore, it is desirable to enhance the testing and validation of these various cameras before real-world applications (e.g., being on the road) to ensure that they do not provide inconsistent or unreliable image quality that undermines their normal operation.

The rear-facing camera 135 may be used, for example, to display upon a display screen of an infotainment system 111, images of objects located behind the vehicle 100. A driver of the vehicle 100 may view these images when performing a reversing operation upon the vehicle 100.

The roof-mounted camera 130 may be a part of a vehicle navigation system when the vehicle 100 is an autonomous vehicle. Images produced by the roof-mounted camera 130 may be processed by the vehicle computer 105 and/or by the auxiliary operations computer 110 for detecting and identifying objects ahead and/or around the vehicle. The roof-mounted camera 130 can have a wide-angle field-of-view and/or may be rotatable upon a mounting base. The vehicle 100 can use information obtained from the image processing to navigate around obstacles.

The driver-side mirror camera 120 may be used for capturing images of vehicles in an adjacent lane on the driver side of the vehicle 100, and the passenger-side mirror camera 125 may be used for capturing images of vehicles in adjacent lanes on the passenger side of the vehicle 100. In an exemplary application, various images captured by the driver-side mirror camera 120, the passenger-side mirror camera 125, and the rear-facing camera 135 may be combined by the vehicle computer 105 and/or by the auxiliary operations computer 110 to produce a computer-generated image that provides a 360-degree field-of-coverage around the vehicle 100. The computer-generated mage may be displayed upon a display screen of the infotainment system 111 to assist the driver to drive the vehicle 100.

The various cameras provided in the vehicle 100 can be any of various types of cameras and can incorporate various types of technologies. For example, a night-vision camera having infra-red lighting and sensors may be used for capturing images in low light conditions. The low light conditions may be present when the vehicle 100 is parked at a spot during the night. The images captured by the night-vision camera may be used for security purposes, such as for preventing vandalism or theft. A stereo camera may be used to capture images that provide depth information that may be useful for determining separation distance between the vehicle 100 and other vehicles when the vehicle 100 is in motion. In another application where minimal processing latency is desired, a pair of cameras may be configured for generating a high frame-rate video feed. The high frame-rate video feed may be generated by interlacing the video feeds of the two cameras. In yet another application, a camera system configured for light detection and ranging (LIDAR) applications may be used. LIDAR applications can include long-distance imaging and/or short distance imaging. Some camera systems may include power-saving features that may be useful for operations in certain environments.

A testing and validation system may facilitate the setup of a camera (e.g., cameras 115, 120, 125, 130, or 135) in an electromagnetic interference environment, which is constrained in both its required setup as well as the environment it is in. Cameras (e.g., cameras 115, 120, 125, 130, and 135) may be subjected to the electromagnetic interference environment before being introduced in real-world scenarios where the cameras need to operate at an optimal level to ensure quality images are being captured and processed with minimal errors. If a camera (e.g., cameras 115, 120, 125, 130, or 135) is interrupted from its normal function under the presence of electromagnetic interference, this would alter the image quality captured by the camera. For example, some of the electromagnetic interference events may include a radiated immunity event, a radiated emissions event, or a conducted emissions event. These events may cause interference and alteration of the image quality of the camera system.

In one or more embodiments, a testing and validation system may provide a mechanism to allow a pass or fail criteria to be judged on a camera (e.g., cameras 115, 120, 125, 130, or 135) under test in real-time during the testing and provides a target framework and a backend processing framework together because of the real-time application. A testing and validation system may allow for a testing and validation environment that does not require having to tune the camera (e.g., cameras 115, 120, 125, 130, or 135) for ideal lighting conditions, setup, distance, etc., which are typically required by camera tests. That is, there is no need to determine pixel sizes, determine a specific color palette, which is typically used to perform tests.

In one or more embodiments, a testing and validation system would facilitate a structural similarity index (SSIM) to be used as the particular index. The SSIM may be a perceptual metric that quantifies image quality degradation caused by processing an image. SSIM may provide a measure of the perceptual difference between two images.

In one or more embodiments, a testing and validation system may use a particular pattern associated with the application-independent methodology used to validate a camera system under a radiated immunity event, a radiated emissions event, or a conducted emissions event. The particular pattern would be used in conjunction with an SSIM scale in the before and after judgment. The particular pattern may comprise a variety of textures and frequency of content that allows it to be applied to different camera field of use, different camera distances, compared to other approaches in performing optical tests. The particular pattern may be a spilled coins image, which is typically used to measure a texture sharpness. A spilled coins image is an image processing pattern that allows the evaluation of sharpness. It has a frequency of content pattern, which allows it to judge that had a variety of extra detail levels. Other types of sharpness targets do not capture that as well.

It is understood that the above descriptions are for purposes of illustration and are not meant to be limiting.

Figure 2:
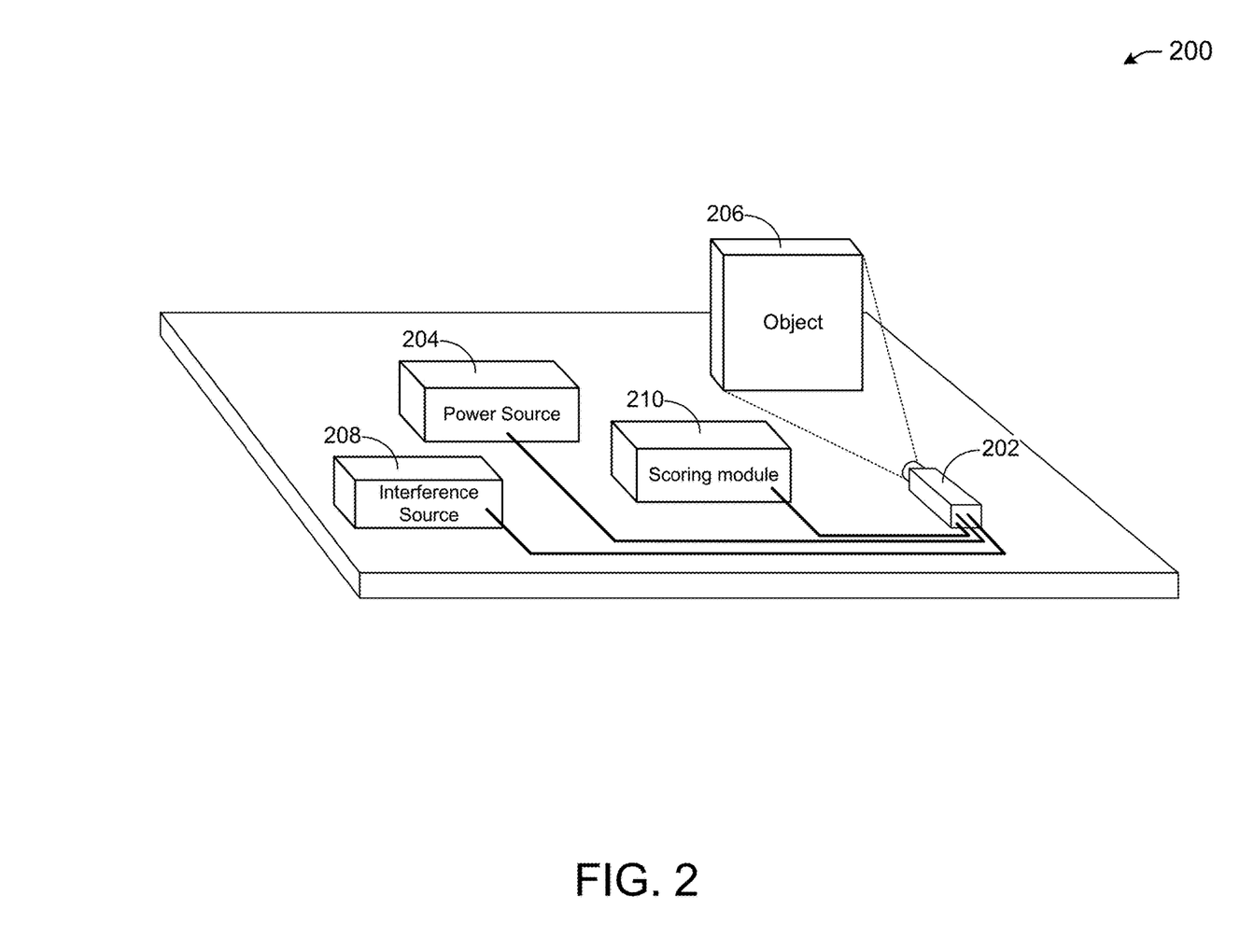
FIG. 2 depicts an illustrative schematic diagram for testing and validation, in accordance with one or more example embodiments of the present disclosure.

FIG. 2 depicts an illustrative schematic diagram for testing and validation, in accordance with one or more example embodiments of the present disclosure.

Referring to FIG. 2, there is shown a testing and validation system 200 for verifying the status of a camera 202. The camera may include a variety of cameras such as wide-field view cameras, stereo cameras, backup cameras, color or monochrome cameras, autonomous vehicle cameras, or any camera that utilizes an optical path. The testing and validation system 200 comprises the camera 202, a power source 204, and object 206, and an interference source 208. The camera 202 may be positioned in front of the object 206 to capture one or more images of the object 206 under normal conditions and other conditions. A normal condition would be considered a condition where noise, interference, or other image degrading conditions are not introduced to the camera 202. Under its normal condition, the camera 202 captures an optical image as input data from the object. The captured input data may be raw data that is sent to a processing unit associated with the camera device to convert the optical image into processed signals. The camera 202 may be connected to a scoring module 210 that provides camera verification by making a judgment about the raw data to determine if the camera passes a validation threshold. The scoring module 210 may utilize a structural similarity index (SSIM) as a scoring index. The SSIM scoring index may be a perceptual metric that quantifies image quality degradation caused by processing an image. SSIM may provide a measure of the perceptual difference between a before and after images. The camera 202 may capture a plurality of images of object 206 and uses the scoring module 210 to validate each image quality using SSIM. The scoring module 210 may record the values registered based on SSIM. In one or more embodiments, the object 206 may be a spilled coins image, which is typically used to measure a texture sharpness. A spilled coins image is an image processing pattern that allows the evaluation of sharpness. It has a frequency of content pattern, which allows it to judge that it had a variety of extra detail levels. Other types of sharpness targets do not capture that as well. In one or more embodiments, the interference source 208 may introduce or the camera 202 to various intensities and different frequencies of radiant energy. The scoring module 210 may provide scores associated with the image qualities of images being captured under the influence of the interference source 208. The scoring module 210 may make a judgment to whether the normal function of the camera 202 has been disrupted based on the SSIM scores resulting from the camera 202 capturing images while being subjected to the interference introduced by the interference source 208. For example, a first image may be first captured by camera 202 under normal conditions (e.g., without influence from the interference source 208), where the first image may be scored by the scoring module 210 using the SSIM scoring index. The SSIM score may indicate whether the camera's operation has been disrupted to a point to classify the camera 202 to be in a failed state. For example, the SSIM score may be compared to a validation threshold. In case the SSIM score is below the validation threshold, the camera 202 may be considered to be in a passing state. However, if the SSIM score is above the validation threshold, the camera 202 may be considered to be in a failed state.

In one or more embodiments, a testing and validation system may facilitate sweeping through various content frequencies from the object and holding for a very short time while capturing images of the object to determine if there are signals that result in a failed state of the camera 202. The capture of an image under normal conditions may be used as a baseline for a given environment in the setup, which may vary as the environment is varied. For example, a camera (e.g., camera 202) may be used in a known environment using a known target (e.g., object 206). Then, the camera would be subjected to an immunity event (e.g., using interference source 208) would result in a deviation of captured image quality. The scoring module 210 may assess the magnitude of deviation during that immunity event to determine a pass or fail status of the camera.

In one or more embodiments, testing and validation system 200 may provide the environment for utilizing an SSIM score index in conjunction with an image capture of a high-frequency content pattern such as a spilled coins image in order to provide an application-independent assessment of image quality of the camera. That is, the testing and validation system 200 may apply to different camera fields of view, different camera distances, and different targets.

It is understood that the above descriptions are for purposes of illustration and are not meant to be limiting.

Figure 3A:
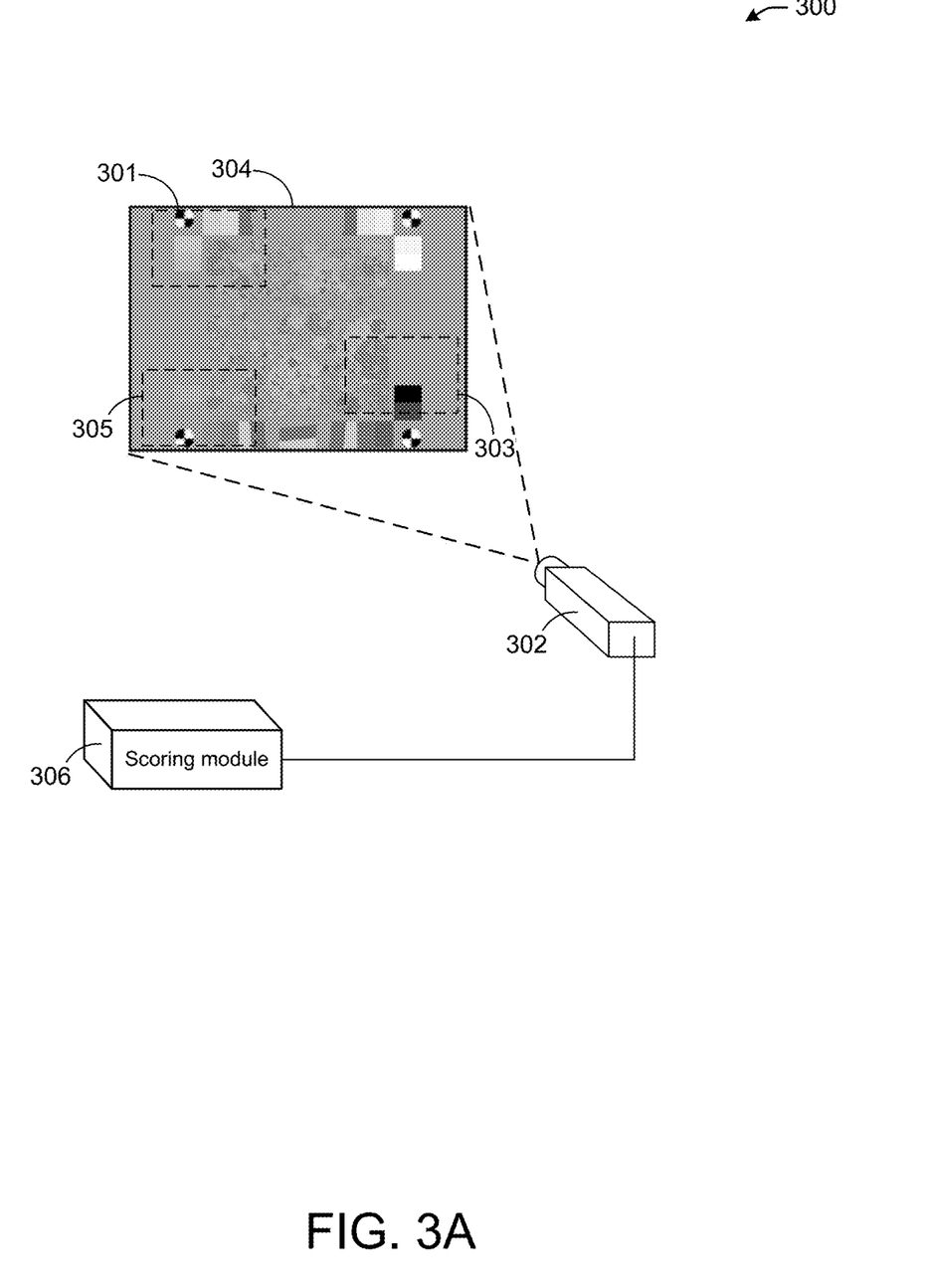
FIG. 3A depicts an illustrative schematic diagram for testing and validation, in accordance with one or more example embodiments of the present disclosure.

FIG. 3A depicts an illustrative schematic diagram 300 for testing and validation, in accordance with one or more example embodiments of the present disclosure.

Referring to FIG. 3A, there is shown a camera 302 pointed to a spilled coins image 304. The camera 302 may be connected to a scoring module 306. The spilled coins image 304 comprises a variety of content frequencies, which makes it suitable for capturing degradations due to environmental interference, such as electromagnetic fields. FIG. 3A represents a normal condition under which camera 302 is operating. This normal condition, where a normal amount of interference may be present, may represent a baseline to be used when comparing images captured of the spilled coins image 304 when camera 302 is subjected to a form of electromagnetic interference, such as a radiated immunity event, a radiated emissions event, or a conducted emissions event.

In FIG. 3A, the spilled coins image 304 may comprise a plurality of regions (e.g., regions 301, 303, 305, etc.), where each of these regions contains content that varies from another region. For example, images of region 301, region 303, and region 305 may result in respective baselines for each of those regions, which may result in a variety of SSIM scores associated with those regions. That is, region 301 may have a different SSIM score than region 303 and region 305. In some embodiments, each of these SSIM scores may be compared to a validation threshold to determine a status of the camera 302. For example, the scoring module 306 generate SSIM scores for each of the regions 301, 303, and 305 and then compare each of the respective SSIM scores to a validation threshold to determine whether any of these regions exceeds the validation threshold, which would then indicate that the camera 302 may be judged to be in a failed state. Considering that FIG. 3A represents the normal condition under which camera 302 is operating, the SSIM scores associated with the various regions of the spilled coins image 304 may be expected to be below the validation threshold. These SSIM scores in this normal condition may represent the baseline scores for those regions, which would then be compared to new SSIM scores scored by the scoring module 306 when the camera 302 is subjected to various levels of electromagnetic interferences. The comparison may result in a magnitude of deviation from the baseline environment of FIG. 3A to the interference event environment (as will be explained in FIG. 3B).

It is understood that the above descriptions are for purposes of illustration and are not meant to be limiting.

Figure 3B:
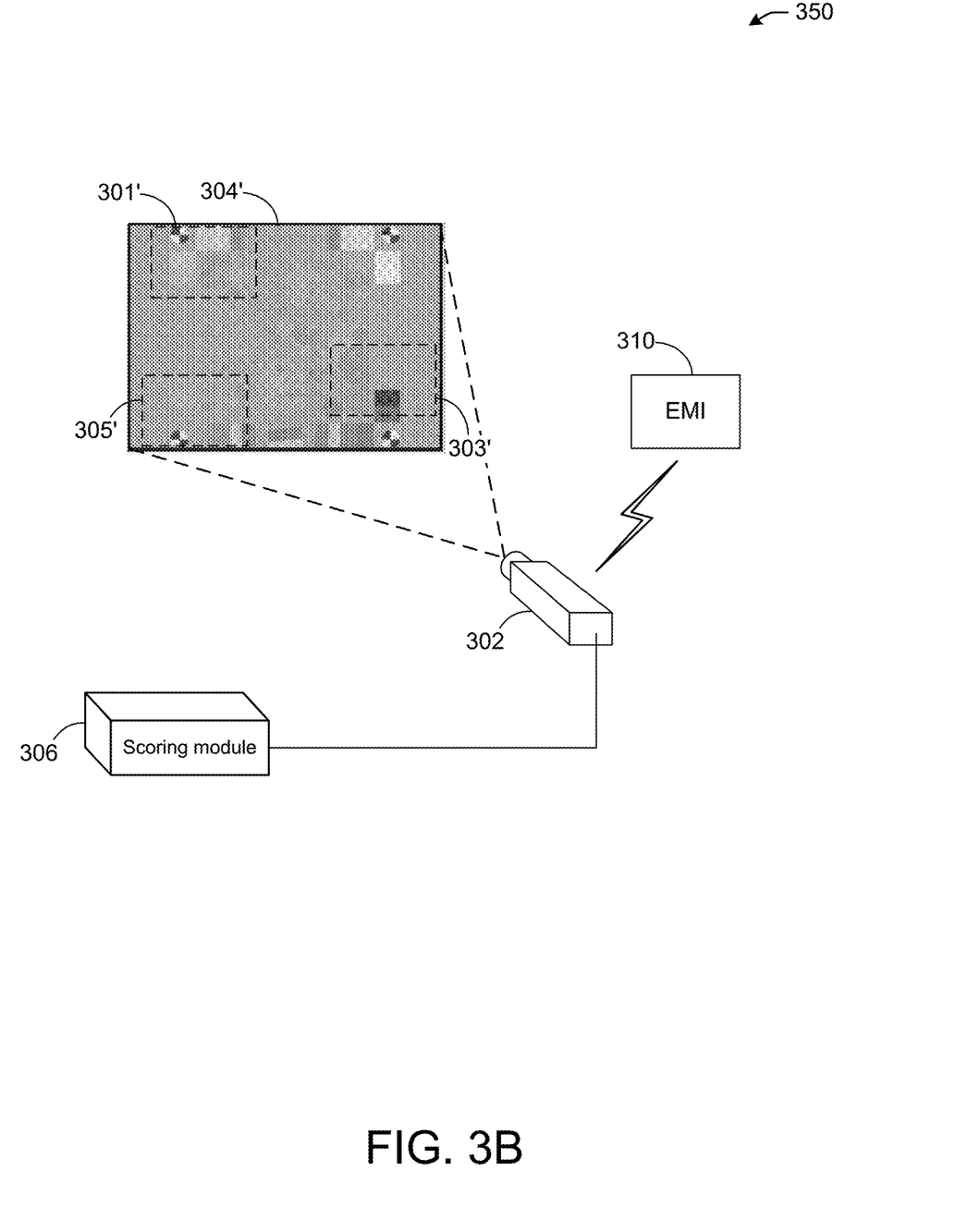
FIG. 3B depicts an illustrative schematic diagram for testing and validation, in accordance with one or more example embodiments of the present disclosure.

FIG. 3B depicts an illustrative schematic diagram 350 for testing and validation, in accordance with one or more example embodiments of the present disclosure.

Referring to FIG. 3B, there is shown a camera 302 pointed to the spilled coins image 304 of FIG. 3A. However, FIG. 3B depicts a resulting spilled coins captured image 304' based on the environment of FIG. 3B. In FIG. 3A, the testing and validation start with having a camera that is known to operate under normal conditions and determining an expected response to capturing images of a known object. In FIG. 3B, the normal conditions are interrupted by injecting electromagnetic interference such as a radiated immunity event and determining the response to capturing images of the known object under these interrupted conditions. Criteria may be imposed on the captured images, such as determining a magnitude of a change between the normal conditions and the interrupted conditions. Based on that change, a pass or fail criteria may be imposed on the camera.

In the environment of FIG. 3B, camera 302 may be subjected to electromagnetic interference (EMI) 310. The EMI 310 may include a radiated immunity event, a radiated emissions event, or a conducted emissions event. Any of these events may introduce interferences that may result in degraded image quality of one or more images captured by camera 302. The camera 302 may be connected to the scoring module 306 of FIG. 3A. As explained above, the spilled coins image 304 comprises a variety of content frequencies, which makes it suitable for capturing degradations due to environmental interference, such as electromagnetic fields. While camera 302 is subjected to EMI 310, camera 302 may capture optical signals as raw data associated with the variety of regions included in spilled coins image 304 of FIG. 3A. The camera 302 may send the raw data to a processing unit associated with the camera 302 to convert the optical images into processed signals. As was shown in FIG. 3A, the spilled coins image 304 comprised a plurality of regions (e.g., regions 301, 303, 305, etc.). FIG. 3B shows resulting images as represented by the raw data captured while camera 302 is subjected to EMI 310 during the capture of optical signals from the spilled coins image 304 of FIG. 3A in the same regions as represented in regions 301', 303', and 305', which corresponds respectively to regions 301, 303, and 305 of FIG. 3A. Images of region 301', region 303', and region 305' may result in respective image changes for each of those regions due to EMI 310. The scoring module 306 may determine SSIM scores associated with each of those regions. That is, region 301' may have a different SSIM score than region 303' and region 305'. In some embodiments, each of these SSIM scores may be compared to a validation threshold to determine the status of the camera 302 under EMI 310. For example, the scoring module 306 may generate SSIM scores for each of the regions 301', 303', and 305' and then compare each of the respective SSIM scores to a validation threshold in order to determine whether any of these regions exceeds the validation threshold, which would then indicate that the camera 302 may be judged to be in a failed state. These SSIM scores under interrupted conditions caused by EMI 310 may represent new scores for those regions, which may be compared to the baseline SSIM scores scored by the scoring module 306 when the camera 302 was in the normal condition environment of FIG. 3A. The comparison may result in a magnitude of deviation from the baseline environment of FIG. 3A to the interference event environment of FIG. 3B. The magnitude of deviation helps determine an amount of change of the image quality compared to a baseline SSIM measurement, which indicates an amount of quality fluctuation as a result of subjecting camera 302 to EMI 310. It is understood that the above descriptions are for purposes of illustration and are not meant to be limiting.

Figure 4:
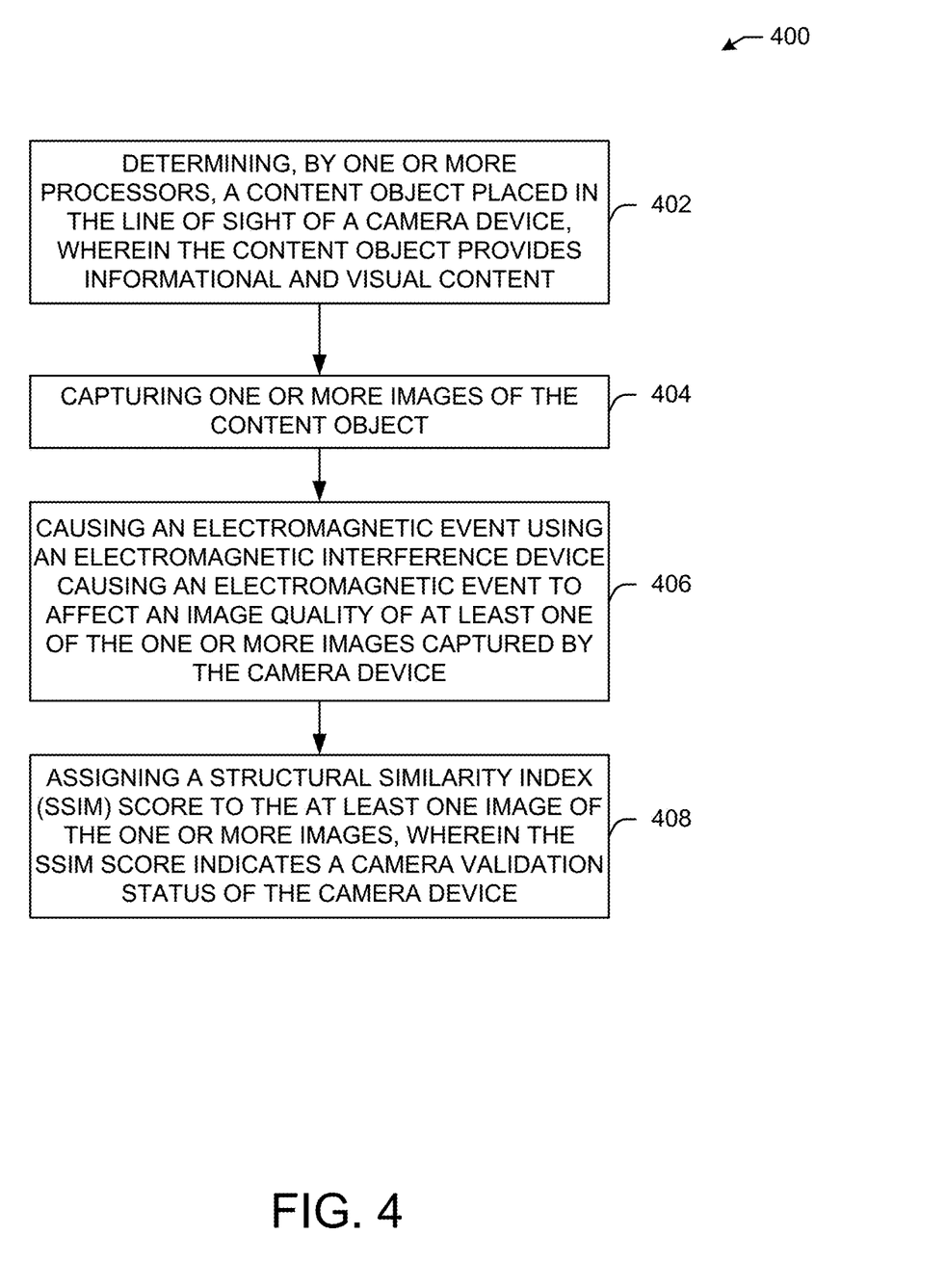
FIG. 4 illustrates a flow diagram of an illustrative process for a testing and validation system, in accordance with one or more example embodiments of the present disclosure.

FIG. 4 illustrates a flow diagram of illustrative process 400 for a testing and validation system, in accordance with one or more example embodiments of the present disclosure.

At block 402, a device (e.g., the camera device 202 of FIG. 2) may determine a high-frequency content object placed in the line of sight of a camera device, wherein the high-frequency content object provides informational and visual content. The high-frequency content object may be a spilled coins image that comprises a variety of textures and frequency of content that allows it to be applied to different camera fields of use, different camera distances, and becomes agnostic of the camera system set up compared to other approaches in performing optical tests. A spilled coins image, which is typically used to measure a texture sharpness. A spilled coins image is an image processing pattern that allows the evaluation of sharpness. It has a frequency of content pattern, which allows it to judge that it had a variety of extra detail levels. Other types of sharpness targets do not capture that as well. The spilled coins image would still cover many failure modes in combination with a metric, such as a structural similarity index (SSIM).

At block 404, the device may capture one or more images of the high-frequency content object. The device may be positioned in front of the high-frequency content object in order to capture one or more images of the high-frequency content object under normal conditions and other conditions. A normal condition would be considered a condition where noise, interference, or other image degrading conditions are not introduced to the camera 202. Under its normal condition, the device may capture an optical image as input data from the object. The captured input data may be raw data that is sent to a processing unit associated with the camera device in order to convert the optical image into processed signals.

At block 406, the device may cause an electromagnetic event using an electromagnetic interference device causing an electromagnetic event to affect image quality of at least one of the one or more images captured by the camera device. The electromagnetic event may comprise a radiated immunity event, a radiated emissions event, or a conducted emissions event.

At block 408, the device may assign an SSIM score to the at least one image of the one or more images, wherein the SSIM score indicates a camera validation status of the camera device. Applying a metric (e.g., SSIM) to a device under a radiated immunity event, a radiated emissions event, or a conducted emissions event while using a particular pattern such as a spilled coins image. The device may be related to one of a wide-field view cameras, stereo cameras, automotive cameras, backup cameras, color or monochrome cameras, autonomous vehicle cameras, or anything that utilizes an optical path. The validation status may be a pass or fail status. The device may compare the SSIM score to a validation threshold. The SSIM score being greater than the validation threshold may indicate that the camera validation status is a fail status. The SSIM score being less than the validation threshold may indicate that the camera validation status is a pass status. The SSIM score may be independent of an application of the camera device. In some scenarios, the device may be connected to a scoring module that provides verification by making a judgment about the raw data to determine if it passes a validation threshold. The scoring module may utilize SSIM as a scoring index. The SSIM scoring index may be a perceptual metric that quantifies image quality degradation caused by processing an image. SSIM may provide a measure of perceptual difference between a before and after images. The device may capture a plurality of images of high-frequency content objects (e.g., spilled coins image) and uses the scoring module to validate each image quality using SSIM. The scoring module may record the values registered based on SSIM. The high-frequency content object may comprise a plurality of regions, where each of these regions contains content that varies from another region. In some embodiments, each of these SSIM scores may be compared to the validation threshold to determine a status of the device. For example, the scoring module may generate SSIM scores for each of the regions and then compare each of the respective SSIM scores to the validation threshold in order to determine whether any of these regions exceeds the validation threshold, which would then indicate that the camera 302 may be judged to be in a failed state, the SSIM scores in normal condition may represent the baseline scores for those regions, which would then be compared to new SSIM scores scored by the scoring module when the device is subjected to various levels of electromagnetic interferences. The comparison may result in a magnitude of deviation from the baseline scores to the interference event scores. It is understood that the above descriptions are for purposes of illustration and are not meant to be limiting.

Figure 5:
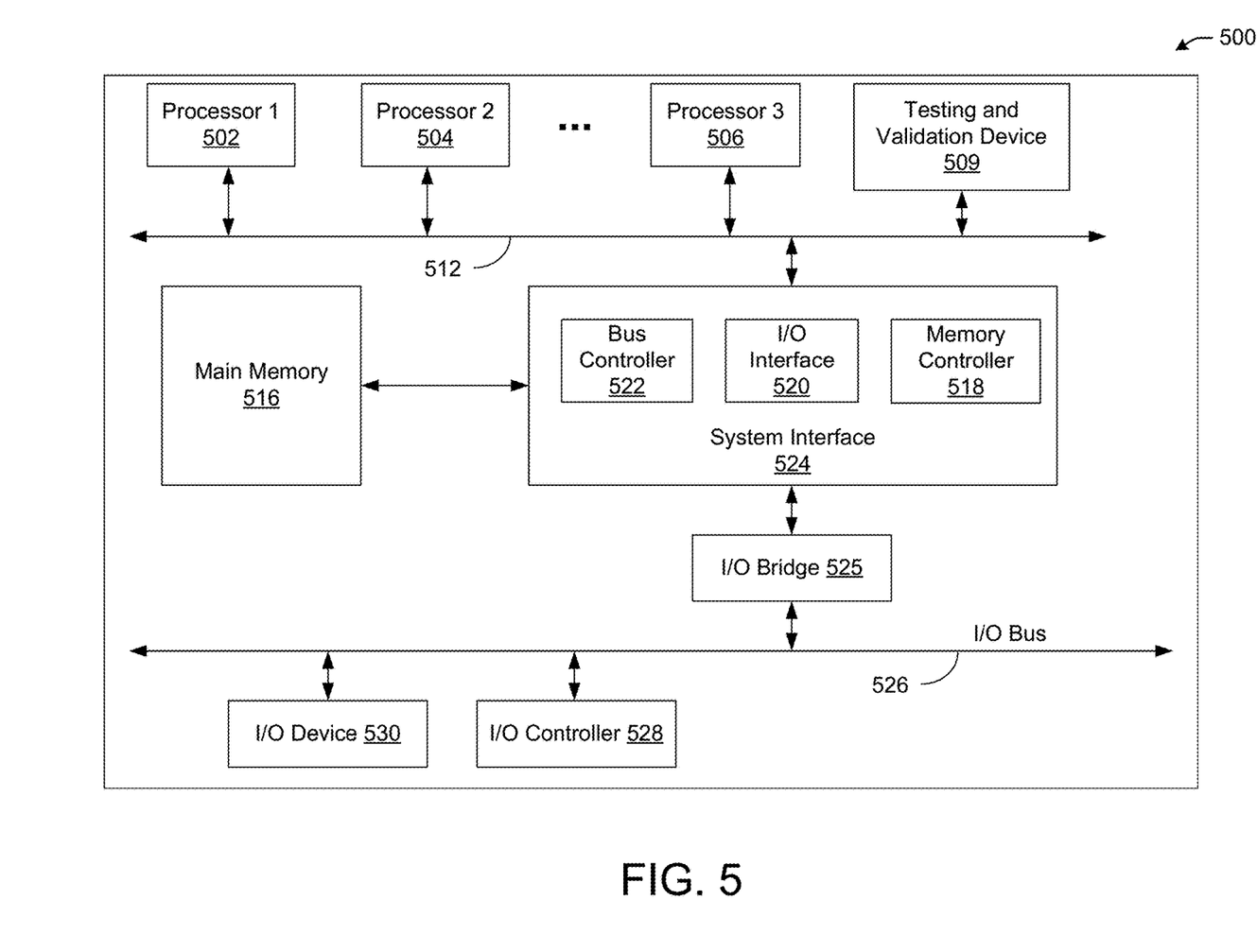
FIG. 5 is a block diagram illustrating an example of a computing device or computer system upon which any of one or more techniques (e.g., methods) may be performed, in accordance with one or more example embodiments of the present disclosure.

FIG. 5 is a block diagram illustrating an example of a computing device or computer system 500 upon which any of one or more techniques (e.g., methods) may be performed, in accordance with one or more example embodiments of the present disclosure.

For example, the computing system 500 of FIG. 5 may represent the one or more processors 132 and/or the one or more measurement devices of FIGS. 2, 3A and 3B, and therefore may assess and validate the sensors of FIG. 1. The computer system (system) includes one or more processors 502-506. Processors 502-506 may include one or more internal levels of cache (not shown) and a bus controller (e.g., bus controller 522) or bus interface (e.g., I/O interface 520) unit to direct interaction with the processor bus 512. A testing and validation device 509 may also be in communication with the Processors 502-506 and may be connected to the processor bus 512.

Processor bus 512, also known as the host bus or the front side bus, may be used to couple the processors 502-506 and/or the testing and validation device 509 with the system interface 524. System interface 524 may be connected to the processor bus 512 to interface other components of the system 500 with the processor bus 512. For example, system interface 524 may include a memory controller 518 for interfacing a main memory 516 with the processor bus 512. The main memory 516 typically includes one or more memory cards and a control circuit (not shown). System interface 524 may also include an input/output (I/O) interface 520 to interface one or more I/O bridges 525 or I/O devices 530 with the processor bus 512. One or more I/O controllers and/or I/O devices may be connected with the I/O bus 526, such as I/O controller 528 and I/O device 530, as illustrated.

I/O device 530 may also include an input device (not shown), such as an alphanumeric input device, including alphanumeric and other keys for communicating information and/or command selections to the processors 502-506 and/or the testing and validation device 509. Another type of user input device includes cursor control, such as a mouse, a trackball, or cursor direction keys for communicating direction information and command selections to the processors 502-506 and/or the testing and validation device 509 and for controlling cursor movement on the display device.

System 500 may include a dynamic storage device, referred to as main memory 516, or a random access memory (RAM) or other computer-readable devices coupled to the processor bus 512 for storing information and instructions to be executed by the processors 502-506 and/or the my testing and validation device 509. Main memory 516 also may be used for storing temporary variables or other intermediate information during execution of instructions by the processors 502-506 and/or the testing and validation device 509. System 500 may include read-only memory (ROM) and/or other static storage device coupled to the processor bus 512 for storing static information and instructions for the processors 502-506 and/or the testing and validation device 509. The system outlined in FIG. 5 is but one possible example of a computer system that may employ or be configured in accordance with aspects of the present disclosure.

According to one embodiment, the above techniques may be performed by computer system 500 in response to processor 504 executing one or more sequences of one or more instructions contained in main memory 516. These instructions may be read into main memory 516 from another machine-readable medium, such as a storage device. Execution of the sequences of instructions contained in main memory 516 may cause processors 502-506 and/or the testing and validation device 509 to perform the process steps described herein. In alternative embodiments, circuitry may be used in place of or in combination with the software instructions. Thus, embodiments of the present disclosure may include both hardware and software components.

The processors 502-506 and/or the testing and validation device 509 may facilitate a validation test for a camera system under electromagnetic interference. A testing and validation system may provide a mechanism to allow a pass or fail criteria to be judged on the camera system under test in real-time during the testing and provides a target framework and a backend processing framework together in real-time application. A testing and validation system may allow for a testing and validation environment that does not require having to tune the camera system for ideal lighting conditions, setup, distance, etc., which are typically required by camera tests. That is, there is no need to determine pixel sizes or determine a specific color palette, which are typically used in order to perform image quality tests.

The processors 502-506 and/or the testing and validation device 509 may facilitate an application independent methodology in which to get a metric associated with validation of a camera system. The metric may be in the notion of a normal state and the notion of interrupted or fail state based on a radiated immunity event, a radiated emissions event, or a conducted emissions event. Therefore, a testing and validation system would lend itself to a before and after judgment and a notion of using a particular index that will allow a before and after score to determine whether a camera system is performing to a predetermined level. The score may be tied to an image quality by using the particular index.

The processors 502-506 and/or the testing and validation device 509 may facilitate a structural similarity index (SSIM) to be used as the particular index. The SSIM may be a perceptual metric that quantifies image quality degradation caused by processing an image. SSIM may provide a measure of perceptual difference between two images.

The processors 502-506 and/or the testing and validation device 509 may use a particular pattern associated with the application-independent methodology used to validate a camera system under a radiated immunity event, a radiated emissions event, or a conducted emissions event. The particular pattern would be used in conjunction with an SSIM scale in the before and after judgment. The particular pattern may comprise a variety of textures and frequency of content that allows it to be applied to different camera field of use, different camera distances, and becomes agnostic of the camera system set up compared to other approaches in performing optical tests. The particular pattern may be a spilled coins image, which is typically used to measure a texture sharpness. A spilled coins image is an image processing pattern that allows the evaluation of sharpness. It has a frequency of content pattern, which allows it to judge that had a variety of extra detail levels. Other types of sharpness targets do not capture that as well.

The processors 502-506 and/or the testing and validation device 509 may facilitate a novel linkage of applying a metric to a camera system under a radiated immunity event, a radiated emissions event, or a conducted emissions event while using a particular pattern such as a spilled coins image. The camera system may be related to one of a wide-field view cameras, stereo cameras, automotive cameras, backup cameras, color or monochrome cameras, autonomous vehicle cameras, or anything that utilizes an optical path.

Various embodiments may be implemented fully or partially in software and/or firmware. This software and/or firmware may take the form of instructions contained in a non-transitory computer-readable storage medium. Those instructions may then be read and executed by one or more processors to enable performance of the operations described herein. The instructions may be in any suitable form, such as, but not limited to source code, compiled code, interpreted code, executable code, static code, dynamic code, and the like. Such a computer-readable medium may include any tangible non-transitory medium for storing information in a form readable by one or more computers, such as, but not limited to read-only memory (ROM); random access memory (RAM); magnetic disk storage media; optical storage media; a flash memory, etc.

A machine-readable medium includes any mechanism for storing or transmitting information in a form (e.g., software, processing application) readable by a machine (e.g., a computer). Such media may take the form of, but is not limited to, non-volatile media and volatile media and may include removable data storage media, non-removable data storage media, and/or external storage devices made available via a wired or wireless network architecture with such computer program products, including one or more database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, SSDs, and the like. The one or more memory devices 606 may include volatile memory (e.g., dynamic random access memory (DRAM), static random access memory (SRAM), etc.) and/or non-volatile memory (e.g., read-only memory (ROM), flash memory, etc.).

Computer program products containing mechanisms to effectuate the systems and methods in accordance with the presently described technology may reside in main memory 516, which may be referred to as machine-readable media. It will be appreciated that machine-readable media may include any tangible non-transitory medium that is capable of storing or encoding instructions to perform any one or more of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the one or more executable instructions or data structures.

In one or more embodiments, a system for camera validation may comprise: a high-frequency content object for providing informational and visual content; a camera device for capturing one or more images of the high-frequency content object; an electromagnetic interference device capable of causing an electromagnetic event to affect an image quality of at least one of the one or more images captured by the camera device; and a scoring module for assigning a structural similarity index (SSIM) score to the at least one image of the one or more images, wherein the SSIM score indicates a camera validation status of the camera device. The high-frequency content object is a spilled coins image. The electromagnetic event comprises a radiated immunity event, a radiated emissions event, or a conducted emissions event. The validation status is a pass or fail status. The system may further comprise a comparison module for comparing the SSIM score to a validation threshold. The SSIM score being greater than the validation threshold indicates that the camera validation status is a fail status. The score being less than the validation threshold indicates that the camera validation status is a pass status. The SSIM score is independent of an application of the camera device.

In one or more embodiments, a method may comprise determining, by one or more processors, a high-frequency content object placed in the line of sight of a camera device, wherein the high-frequency content object provides informational and visual content; capturing one or more images of the high-frequency content object; causing an electromagnetic event using an electromagnetic interference device causing an electromagnetic event to affect an image quality of at least one of the one or more images captured by the camera device; and assigning a structural similarity index (SSIM) score to the at least one image of the one or more images, wherein the SSIM score indicates a camera validation status of the camera device. The high-frequency content object is a spilled coins image. The electromagnetic event comprises a radiated immunity event, a radiated emissions event, or a conducted emissions event. The validation status is a pass or fail status. The method may further comprise comparing the SSIM score to a validation threshold. The SSIM score being greater than the validation threshold indicates that the camera validation status is a fail status. The SSIM score being less than the validation threshold indicates that the camera validation status is a pass status. The SSIM score is independent of an application of the camera device.

In one or more embodiments, a non-transitory computer-readable medium storing computer-executable instructions which when executed by one or more processors may result in performing operations that would comprise: determining a high-frequency content object placed in the line of sight of a camera device, wherein the high-frequency content object provides informational and visual content; capturing one or more images of the high-frequency content object; causing an electromagnetic event using an electromagnetic interference device causing an electromagnetic event to affect an image quality of at least one of the one or more images captured by the camera device; and assigning a structural similarity index (SSIM) score to the at least one image of the one or more images, wherein the SSIM score indicates a camera validation status of the camera device. The high-frequency content object is a spilled coins image. The electromagnetic event comprises a radiated immunity event, a radiated emissions event, or a conducted emissions event. The validation status is a pass or fail status. The operations may further comprise comparing the SSIM score to a validation threshold. The SSIM score being greater than the validation threshold indicates that the camera validation status is a fail status. The SSIM score being less than the validation threshold indicates that the camera validation status is a pass status. The SSIM score is independent of an application of the camera device.

Embodiments of the present disclosure include various steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software, and/or firmware.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations together with all equivalents thereof.

The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

The word "exemplary" is used herein to mean "serving as an example, instance, or illustration." Any embodiment described herein as "exemplary" is not necessarily to be construed as preferred or advantageous over other embodiments.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or any other manner.

It is understood that the above descriptions are for purposes of illustration and are not meant to be limiting.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

What is claimed is:

1. A system for camera validation comprising:
a content object for providing informational and visual content;
a camera device for capturing one or more images of the content object;
an electromagnetic interference device capable of causing an electromagnetic event to affect an image quality of at least one of the one or more images captured by the camera device; and
a scoring module that assigns a structural similarity index (SSIM) score to the at least one image of the one or more images, wherein the SSIM score indicates a camera validation status of the camera device.

2. The system of claim 1, wherein the electromagnetic event comprises a radiated interference event or a conducted interference event.

3. The system of claim 1, wherein the validation status is a pass or a fail status.

4. The system of claim 1, wherein the system further comprises a comparison module that compares the SSIM score to a validation threshold.

5. The system of claim 4, wherein the camera validation status is a fail status when the SSIM score is below the validation threshold.

6. The system of claim 5, wherein the camera validation status is a pass status when the SSIM score exceeds the validation threshold.

7. The system of claim 1, wherein the content object is a spilled coins image.

8. The system of claim 1, wherein the SSIM score is independent of at least one of a resolution of the camera device, field-of-view, orientation, or lighting.

9. A method comprising:
determining, by one or more processors, a high-frequency content object placed in a line of sight of a camera device, wherein the high-frequency content object provides informational and visual content;
capturing one or more images of the high-frequency content object;
causing an electromagnetic event using an electromagnetic interference device, the electromagnetic event affecting an image quality of at least one of the one or more images captured by the camera device; and
assigning a structural similarity index (SSIM) score to the at least one image of the one or more images, wherein the SSIM score indicates a camera validation status of the camera device.

10. The method of claim 9, wherein the electromagnetic event comprises a radiated interference event or a conducted interference event.

11. The method of claim 9, wherein the validation status is a pass or fail status.

12. The method of claim 9, wherein the method further comprises comparing the SSIM score to a validation threshold.

13. The method of claim 12, wherein the camera validation status is a fail status when the SSIM score is below the validation threshold.

14. The method of claim 9, wherein the high-frequency content object is a spilled coins image.

15. The method of claim 12, wherein the camera validation status is a pass status when the SSIM score exceeds the validation threshold.

16. The method of claim 9, wherein the SSIM score is independent of at least one of a resolution of the camera device, field-of-view, orientation, or lighting.

17. A non-transitory computer-readable medium storing computer-executable instructions which when executed by one or more processors result in performing operations comprising:

determining a content object placed in a line of sight of a camera device, wherein the content object provides informational and visual content;

capturing one or more images of the content object;

causing an electromagnetic event using an electromagnetic interference device causing an electromagnetic event to affect an image quality of at least one of the one or more images captured by the camera device; and assigning a structural similarity index (SSIM) score to the at least one image of the one or more images, wherein the SSIM score indicates a camera validation status of the camera device.

18. The non-transitory computer-readable medium of claim 17, wherein the electromagnetic event comprises a radiated interference event or a conducted interference event.

19. The non-transitory computer-readable medium of claim 17, wherein the validation status is a pass or fail status.

20. The non-transitory computer-readable medium of claim 17, wherein the content object is a spilled coins image.

* * * * *